US012677611B2

(12) United States Patent
Arai et al.

(10) Patent No.: US 12,677,611 B2
(45) Date of Patent: Jul. 7, 2026

(54) SUBSTRATE PROCESSING METHOD AND SUBSTRATE PROCESSING APPARATUS

(71) Applicant: Tokyo Electron Limited, Tokyo (JP)

(72) Inventors: Hiroki Arai, Yamanashi (JP); Tadashi Mitsunari, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 394 days.

(21) Appl. No.: 18/267,596

(22) PCT Filed: Dec. 7, 2021

(86) PCT No.: PCT/JP2021/044871
§ 371 (c)(1),
(2) Date: Jun. 15, 2023

(87) PCT Pub. No.: WO2022/138129
PCT Pub. Date: Jun. 30, 2022

(65) Prior Publication Data
US 2024/0044006 A1    Feb. 8, 2024

(30) Foreign Application Priority Data

Dec. 21, 2020    (JP) ................................ 2020-211198

(51) Int. Cl.
| | |
|---|---|
| *H10P 14/60* | (2026.01) |
| *C23C 16/26* | (2006.01) |
| *C23C 16/56* | (2006.01) |
| *H01J 37/32* | (2006.01) |
| *H10P 14/20* | (2026.01) |
| *H10P 14/24* | (2026.01) |

(52) U.S. Cl.
CPC .......... *H10P 14/6336* (2026.01); *C23C 16/26* (2013.01); *C23C 16/56* (2013.01); *H01J 37/32091* (2013.01); *H01J 37/32449* (2013.01); *H01J 37/32568* (2013.01); *H01J 37/32834* (2013.01); *H01J 2237/3321* (2013.01); *H10P 14/24* (2026.01); *H10P 14/3406* (2026.01)

(58) Field of Classification Search
CPC ................................ C23C 16/26; C23C 16/56
See application file for complete search history.

(56) References Cited

U.S. PATENT DOCUMENTS 10,388,513 B1 *  8/2019  Blanquart ......... H01L 21/76229

FOREIGN PATENT DOCUMENTS

| | | |
|---|---|---|
| JP | 2002-012972 A | 1/2002 |
| JP | 2002-194547 A | 7/2002 |
| JP | 2020-191427 A | 11/2020 |
| WO | 2019/245735 A1 | 12/2019 |
| WO | WO-2020197866 A1 * 10/2020 ......... H01L 21/0332 |

OTHER PUBLICATIONS

International Search Report issued on Jan. 25, 2022 for WO 2022/138129 A1 (4 pages).

* cited by examiner

*Primary Examiner* — Michael P Wieczorek
(74) *Attorney, Agent, or Firm* — Venjuris, P.C.

(57) ABSTRACT

A substrate processing method includes forming a carbon film on a substrate by plasma CVD using a processing gas including a carbon-containing gas; and performing a plasma post-processing on the formed carbon film, thereby reducing film stress of the carbon film by plasma of the processing gas including helium gas or a mixture of helium gas and argon gas but not including hydrogen.

11 Claims, 9 Drawing Sheets

(a)                                               (b)

▲ : FILM THICKNESS    O : STRESS

SUBSTRATE PROCESSING METHOD AND SUBSTRATE PROCESSING APPARATUS

CROSS REFERENCE TO RELATED APPLICATIONS

This application is a national phase of PCT application No. PCT/JP2021/044871, filed on Dec. 7, 2021, which claims priority from Japanese patent application No. 2020-211198, filed on Dec. 21, 2020, all of which are incorporated herein by reference.

TECHNICAL FIELD

The present disclosure relates to a substrate processing method and a substrate processing apparatus.

BACKGROUND

With the recent development in semiconductor microfabrication technology, the argon-fluoride (ArF) resist patterned with short-wavelength light is being used. As the ArF resist has a relatively low dry etching resistance, amorphous carbon has been implemented as a hard mask with relatively high dry etching resistance (see Patent Documents 1 and 2). Furthermore, Patent Documents 1 and 2 disclose the use of plasma chemical vapor deposition (CVD) to deposit such amorphous carbon films.

PRIOR ART DOCUMENT

Patent Document

Patent Document 1: JP 2002-194547 A
Patent Document 2: JP 2002-012972 A

Non-Patent Document

Non-Patent Document 1: Robertson, J., "Diamond-like amorphous carbon," Materials Science and Engineering R 37:129-281, 2002

SUMMARY OF THE INVENTION

Problem to be Solved

The present disclosure provides a substrate processing method and a substrate processing apparatus capable of achieving a low-stress carbon film while maintaining favorable film quality.

Means to Solve the Problem

A substrate processing method according to one aspect of the present disclosure includes forming a carbon film on a substrate by plasma CVD using a processing gas including a carbon-containing gas and performing a plasma post-processing on the carbon film formed at the forming to reduce film stress of the carbon film. The plasma post-processing is carried out by plasma of a processing gas including helium gas or a mixture of helium and argon gases but not including hydrogen.

Effect of the Invention

According to the present disclosure, there are provided a substrate processing method and a substrate processing apparatus capable of achieving a low-stress carbon film while maintaining favorable film quality.

DETAILED DESCRIPTION TO EXECUTE THE
INVENTION

Embodiments are now described with reference to the accompanying drawings.

<Exemplary Substrate Processing Apparatus>

Figure 1:
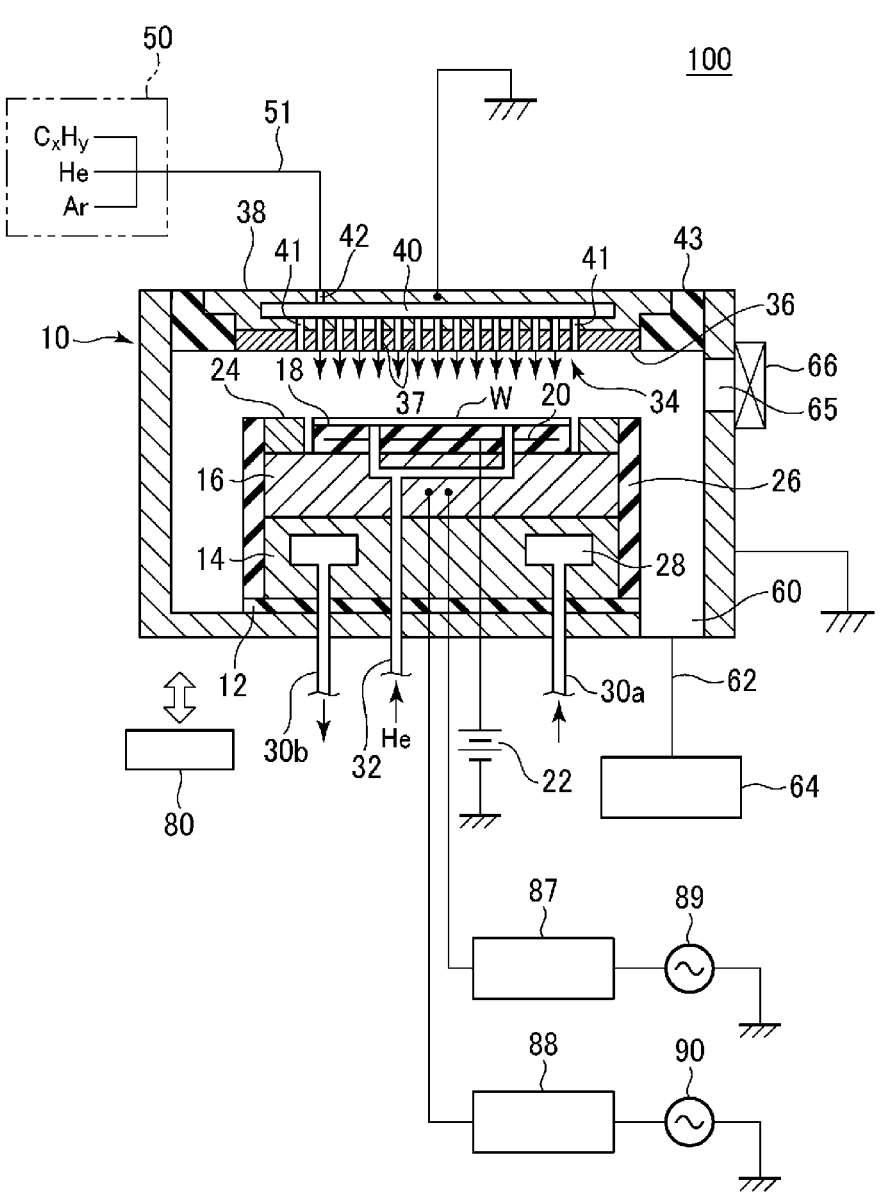
FIG. 1 is a cross-sectional view schematically illustrating an exemplary substrate processing apparatus that carries out a substrate processing method according to an embodiment.

FIG. 1 is a cross-sectional view schematically illustrating an exemplary substrate processing apparatus carrying out a substrate processing method according to an embodiment.

The substrate processing apparatus 100 according to the present embodiment is configured as a capacitively-coupled plasma processing apparatus used for processing a substrate W. The substrate processing apparatus 100 forms a carbon film as a hard mask on a substrate W and then subjects the film-formed substrate to a post-processing, which will be described later. Examples of the substrate W include, but are not limited to, a semiconductor wafer.

The substrate processing apparatus 100 has a processing container (or chamber) 10 made of metal such as aluminum, with a surface that is subjected to anodization. The processing container 10 is substantially cylindrical and is grounded for safety.

A columnar support 14 made of metal is disposed at the bottom of the processing container 10 via an insulating plate 12 that includes, for example, ceramics, and a substrate stage 16, which is made of metal such as aluminum, is provided on the support 14. The substrate stage 16 constitutes a lower electrode. The substrate stage 16 has an electrostatic chuck 18 that absorbs and holds the substrate W by electrostatic force on its upper surface. The electrostatic chuck 18 has a structure in which an electrode 20 is provided inside an insulator. The direct current (DC) voltage applied from a DC power source 22 to the electrode 20 allows the substrate W to be absorbed and held by electrostatic force such as Coulomb force.

A conductive focus ring 24, which includes, for example, silicon is disposed around the electrostatic chuck 18 to improve the uniformity of plasma processing. There is provided a cylindrical inner wall member 26, which includes, for example, quartz on the side surfaces of the substrate stage 16 and the support 14.

There is provided a refrigerant chamber 28 inside the support 14. In this refrigerant chamber 28, a coolant such as cooling water is supplied in circulation via pipes 30a and 30b from a chiller unit (not illustrated) located outside. The coolant allows for the control of the processing temperature of the substrate W on the substrate stage 16.

Furthermore, a heat transfer gas such as helium (He) gas is supplied from a heat transfer gas supply mechanism (not illustrated) to a space between the upper surface of the electrostatic chuck 18 and the back surface of the semiconductor wafer W via a gas supply line 32.

An upper electrode 34 is formed above the substrate stage (lower electrode) 16 to face the substrate stage 16. In addition, a space between the upper electrode 34 and the substrate stage (lower electrode) 16 defines a plasma generation space. The upper electrode 34 is grounded.

The upper electrode 34 is supported above the processing container 10 by an insulating shielding member 43. The upper electrode 34 includes an electrode plate 36 and an electrode support 38. The electrode plate 36 forms a surface facing the substrate stage 16 and has a plurality of gas ejection holes 37. The electrode support 38 supports the electrode plate 36 in a detachable manner and has a water-cooled structure. A gas diffusion chamber 40 is provided inside the electrode support 38, and a plurality of gas flow holes 41 communicating with the gas ejection holes 37 extend downward from the gas diffusion chamber 40. The electrode support 38 is formed with a gas introduction port 42 that guides the processing gas to the gas diffusion chamber 40. The gas introduction port 42 is connected to a gas pipe 51 connected to a gas supply unit 50, which will be described later. Furthermore, the processing gas is supplied from the gas supply unit 50 to the gas diffusion chamber 40 and then is supplied toward the substrate stage 16, which is the lower electrode, into the processing container 10 via the gas flow hole 41 and the gas ejection hole 37. In other words, the upper electrode 34 is configured as a showerhead.

The gas supply unit 50 has a plurality of gas supply sources and a plurality of gas supply pipes. The gas supply sources individually supply a carbon-containing gas ($C_xH_y$), helium (He) gas, and argon (Ar) gas. The gas supply pipes are used to allow the gas supply sources to supply each gas. The gas supply pipes are each provided with an on-off valve and a flow controller (both are not illustrated) such as a mass flow controller, thereby enabling the supply or stop of the supply of gas and controlling the flow rate of each gas.

An exhaust port 60 is provided at the bottom of the processing container 10. The exhaust port 60 is connected to an exhaust device 64 via an exhaust pipe 62. The exhaust device 64 has an automatic pressure control valve and a vacuum pump. The exhaust device 64 makes it possible to exhaust the inside of the processing container 10 and maintain the inside of the processing container 10 at a desired degree of vacuum. A transfer port 65 is provided on the side wall of the processing container 10 to load or unload the substrate W to or from the processing container 10, and is configured to be opened and closed by a gate valve 66. Moreover, ta detachable deposition shield (not illustrated) is provided along the inner wall of the processing container 10 to prevent etching by-products (deposits) from adhering to the processing container 10.

The substrate stage 16, serving as the lower electrode, is electrically connected to a first radio-frequency power supply 89 via a matching unit 87 and also electrically connected to a second radio-frequency power supply 90 via a matching unit 88. The first radio-frequency power supply 89 has a higher frequency than that of the second radio-frequency power supply 90. The radio-frequency power supplied from the first radio-frequency power supply 89 may have a frequency of 100 MHz or higher and deliver a power ranging from 500 to 3,000 W. Similarly, the radio-frequency power supplied from the second radio-frequency power supply 90 may have a frequency of 13.56 MHz or lower and deliver a power ranging from 100 to 5,000 W. The first radio-frequency power supply 89 and the second radio-frequency power supply 90 constitute a radio-frequency power supply unit.

The matching units 87 and 88 are responsible for matching the load (plasma) impedance to the respective impedances of the first and second radio-frequency power supplies 89 and 90. In other words, the matching units 87 and 88 ensure that the internal impedance and load impedance of the first and second radio-frequency power supplies 89 and 90 are seemingly identical when plasma is generated in the processing container 10.

The valves and the flow rate controllers of the gas supply unit 50, and the radio-frequency power supplies, which are components of the substrate processing apparatus 100, are controlled by a control unit 80. The control unit 80 has a main control device equipped with a CPU and also has an input device, an output device, a display device, and a storage device. Additionally, the processing performed by the substrate processing apparatus 100 is controlled on the basis of a processing recipe stored in a storage medium of the storage device.

<Substrate Processing Method>

A substrate processing method according to an embodiment carried out by the substrate processing apparatus illustrated in FIG. 1 is now described.

Figure 2:
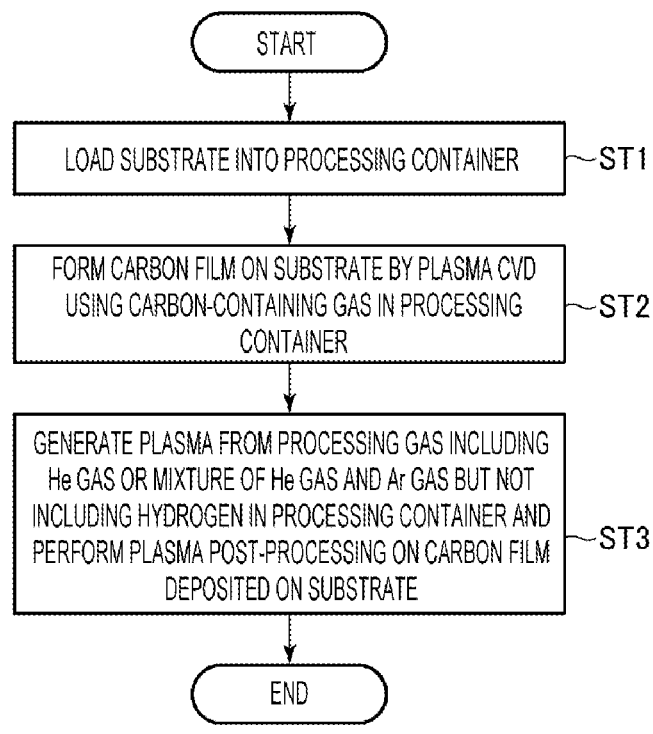
FIG. 2 is a flowchart illustrating the procedure of the substrate processing method according to one embodiment.

FIG. 2 is a flowchart illustrating the procedure of the substrate processing method according to an embodiment. As illustrated in FIG. 2, in the present embodiment, the substrate W is first loaded into the processing container 10 (step ST1). Then, in the processing container 10, a carbon film is formed on the substrate W by plasma chemical vapor deposition (CVD) using a carbon-containing gas (step ST2). Subsequently, plasma is generated from a processing gas including a helium (He) gas or a mixture of He and argon (Ar) gases but not including hydrogen in the processing chamber 10, and the carbon film formed on the substrate W is subjected to a plasma post-processing (Step ST3).

Upon the carbon film formation in step ST2, the pressure inside the processing container 10 may be set in a range from 1 to 50 mTorr (0.13 to 6.66 Pa), for example, 20 mTorr (2.66 Pa). In addition, the temperature of the substrate W may be 150° C. or lower. Upon the carbon film formation, the gas supply unit 50 supplies the processing chamber with, as processing gases, a carbon-containing gas ($C_xH_y$) as a raw material gas, as well as an Ar gas and/or a He gas as noble gases. In addition, the radio-frequency power is supplied from the first and second radio-frequency power supplies 89 and 90 to the substrate stage 16, which serves as the lower electrode. The first radio-frequency power supply 89 supplies the radio-frequency power for plasma generation, and the second radio-frequency power supply 90 supplies the radio-frequency power for bias application. Thus, a radio-frequency electric field is formed between the upper electrode 34 and the substrate stage 16, which serves as the lower electrode, so that capacitively-coupled plasma is generated. Then, the carbon film is formed on the substrate W by plasma CVD using the plasma of the processing gas.

The carbon film formed in this manner has amorphous properties and is constituted as diamond-like carbon with a large $sp^3$ bond ratio, resulting in a radio density and etching resistance. Consequently, the carbon film formed in this manner is suitable as a hard mask.

Examples of the carbon-containing gas that may be used as the raw material gas include Acetylene ($C_2H_2$) gas. Examples of the carbon-containing gas include methane ($CH_4$) gas, ethylene ($C_2H_4$) gas, ethane ($C_2H_6$) gas, propylene ($C_3H_6$) gas, propyne ($C_3H_4$) gas, propane ($C_3H_8$) gas, butane ($C_4H_{10}$) gas, butylene ($C_4H_8$) gas, butadiene ($C_4H_6$) gas, phenylacetylene ($C_8H_6$) gas, in addition to acetylene ($C_2H_2$) gas. Alternatively, a mixed gas including a plurality of gases selected among these gases may be used.

The Ar gas and/or He gas, which may be used as the noble gas, is added as a diluent gas and turned into plasma with the raw material gas. The flow rate ratio of He gas to a total of He gas and Ar gas (He gas flow rate/(He gas flow rate+Ar gas flow rate)×100%) may be in the range of 60 to 90%.

The flow rate of the carbon-containing gas may be in the range of 30 to 300 sccm, and the flow rate of the noble gas may be in the range of 15 to 1,000 sccm.

The radio-frequency power for plasma generation supplied from the first radio-frequency power supply 89 may have a frequency of 100 MHz or higher (e.g., 100 MHz) and power of 500 to 3,000 W. In addition, the radio-frequency power for bias application supplied from the second radio-frequency power supply 90 may have a frequency of 13.56 MHz or lower (e.g., 13.56 MHz) and power of 100 to 5,000 W.

After the completion of step ST2, the processing container 10 is purged to adjust the pressure inside the processing container 10 and the temperature of the substrate W. Then, the plasma post-processing of step ST3 is performed. In the plasma post-processing in step ST3, the substrate W on which the carbon film is formed is post-processed using plasma of a gas including He gas or a mixture of He gas and Ar gas but not including hydrogen, leading to a reduction of the stress of the carbon film formed in step ST2. Moreover, the stress of the film is represented by a positive sign in the compressive direction and a negative sign in the tensile direction, so the reduction in the stress means that the absolute value of the stress becomes smaller.

The carbon film formed using plasma CVD in step ST2 exhibits high density and favorable dry etching resistance but is prone to high stress. When a film with the same level of stress is formed on a substrate, the amount of film warpage increases with the thickness of the film. Thus, the allowable amount of warpage (e.g., 200 μm) for transfer and lithography may be exceeded, making it challenging to perform the post-processing on the substrate after the formation of a thick carbon film. Moreover, in the case of forming a carbon film as a hard mask, the subsequent step involves forming a SiON film, which is then heated to a temperature of 400° C. As a result, the carbon film changes into a film with even higher stress. Therefore, warpage of the substrate becomes a problem.

In this regard, the plasma post-processing in step ST3 may reduce film stress while maintaining the quality (density and dry etching resistance) of the carbon film.

Hereinafter, the mechanism for estimating the film stress relaxation in step ST3 will be described with reference to FIG. 3.

Non-Patent Document 1 also discloses that one of the factors contributing to stress is typically local distortion caused by a difference in lattice length resulting from a mixture of $sp^3$ and $sp^2$ bonding states in a film. In the plasma CVD as well, the internal distortion is considered to occur due to a mixture of multiple bonding states in a film. This internal distortion is considered challenging to relax in a film with many $sp^3$ bonds due to the low degree of bond freedom. In addition, the carbon film formed using plasma CVD as the method according to the present embodiment is diamond-like carbon including many $sp^3$ bonds as bonds between C atoms. Since such a carbon film includes approximately 20% of hydrogen, terminals such as $CH_3$ or CH, are present. In other words, it is considered that the state is as illustrated in part (a) of FIG. 3. Thus, the presence of terminals such as $CH_3$ or CH including hydrogen or the presence of $sp^2$ bonds causes internal distortion, resulting in increased stress. Furthermore, in forming the SiON film, annealing at a temperature of 400° C. causes the evasion of Ar in the film. In this case, additional distortion occurs in the empty vacancies newly created due to the evasion of argon, so the distortion in the carbon film is not relaxed, leading to increased stress in the carbon film.

Figure 3:
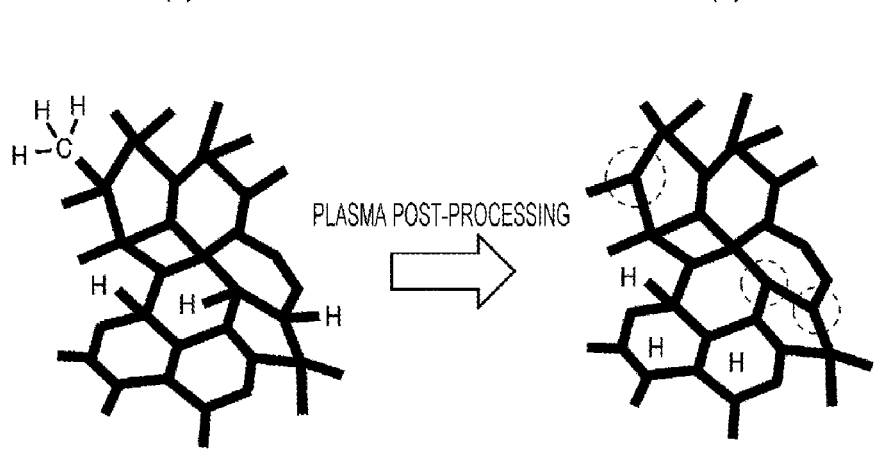
FIG. 3 is a diagram illustrating the mechanism for estimating the relaxation of film stress through plasma post-processing.

Meanwhile, when the plasma post-processing of step ST3 is performed after the carbon film is formed, the carbon film gains energy from the ion energy generated by the plasma, which in turn facilitates the movement of H in terminals such as $CH_3$ or CH in the film, as illustrated in the portion surrounded by the dotted line in part (b) of FIG. 3. This movement increases the number of single bonds of $sp^2$, thereby improving the degree of freedom of the film. Consequently, this structure rearrangement is presumed to relieve the film stress eventually. Since the movement of hydrogen occurs over a short distance, the film composition does not vary significantly. Moreover, even after annealing evades Ar gas in the film, the degree of freedom of the film is improved, which is considered to further alleviate the distortion in the carbon film. For this reason, after performing the plasma post-processing of ST3, annealing does not increase the stress of the carbon film, but rather reduces the film stress.

Such an estimation mechanism described above is based on the secondary ion mass spectrometry (SIMS) examination of the composition (concentrations of C, H, and Ar) in the depth direction each after the film formation, plasma post-processing, and annealing. The examination results indicated no significant compositional variation in the depth direction in the plasma post-processing but annealing led to the evasion of Ar gas. In other words, the results obtained through SIMS suggested that the variation in the stress due to the plasma post-processing was not based on the variation in composition but rather the possibility due to a variation in the bonding state. This led us to conceive the mechanism described above.

During the plasma post-processing in step ST3, the pressure in the processing container 10 may be set in the range of 10 to 100 mTorr (1.33 to 13.3 Pa), for example, set to 20 mTorr (2.66 Pa). Moreover, the temperature of the substrate W may be 200° C. or lower. Then, the gas supply unit 50 supplies the processing chamber 10 with a gas including He gas or a mixture of He gas and Ar gas but not including hydrogen as the processing gas. The second radio-frequency power supply 90 supplies the substrate stage, which is the lower electrode, with the radio-frequency power of 13.56 MHz or lower for plasma generation. This allows for the generation of plasma of the processing gas between the upper electrode 34 and the substrate stage 16 acting as the lower electrode, performing the plasma post-processing of the carbon film on the substrate W.

The reason for excluding hydrogen from the processing gas is that hydrogen contained in the carbon-containing gas has a high affinity for the carbon-containing gas, and has a stress-relieving effect but, the inclusion of hydrogen leads to a decrease in film density and dry etching rate (DER). In contrast, neither He gas nor Ar gas affects the film quality of the carbon film. Meanwhile, He gas has a greater film stress-relieving effect than Ar gas. Thus, the processing gas used for the post-processing is either He gas or a mixed gas of He gas and Ar gas but not including hydrogen. The He gas alone or a mixed gas of He gas and Ar gas is preferable. The flow rate ratio of He gas to a total of He gas and Ar gas (He gas flow rate/(He gas flow rate+Ar gas flow rate)×100%) may be set to 80% or higher. Setting the flow rate ratio of He gas to a total of He gas and Ar gas to 80% or higher makes it possible for the stress relaxation effect to be enhanced and the variation in film thickness to be reduced. More preferably, the ratio is set to 90% or higher. The flow rate of the processing gas in step ST3 may be set between 10 and 500 sccm.

As for the radio-frequency power, two frequencies may be applied from the first radio-frequency power supply 89 and the second radio-frequency power supply 90 as in step ST2. However, applying too high frequency or applying two frequencies including a high frequency may cause the disadvantage of reducing the stress reduction effect and varying the film thickness. Considering this perspective, the radio-frequency power for the plasma post-processing may be applied at a single frequency of 13.56 MHz or lower. In the substrate processing apparatus 100 illustrated in FIG. 1, it is recommended that only the second radio-frequency power supply 90 operating at 13.56 MHz or lower frequency supplies the substrate stage 16, which is the lower electrode with the radio-frequency power.

In step ST3 as well, supplying the radio-frequency power to the substrate stage 16, which is the lower electrode, allows a radio-frequency electric field to be formed between the upper electrode 34 and the substrate stage 16, which is the lower electrode, thereby generating capacitively-coupled plasma. Then, the post-processing using the plasma of the processing gas is carried out, and the stress of the carbon film is reduced.

In the plasma post-processing in step ST3, the stress reduction effect is less dependent on film thickness, and even though the carbon film is 1 μm thick, the stress may be reduced by processing for approximately 2 minutes.

A carbon film used as a hard mask is produced by forming a film such as a SiON film on it and annealing it at temperatures between 200 to 450° C., for instance, at 400° C. In this case, when annealing is applied directly after forming a carbon film by plasma CVD as in the conventional method, the distortion of the carbon film will not be relaxed, resulting in a higher stress film. The stress occurring in such a case works in the compressive direction, which increases the amount of warpage of the substrate (semiconductor wafer). The hard mask often has thickness of approximately 1 μm, leading to significant substrate warpage and causing challenges in subsequent lithography processing. In contrast, the present embodiment makes it possible to relieve the film stress by performing the plasma post-processing after forming the carbon film, which relieves the stress of the carbon film during subsequent annealing without any increase in stress. This approach avoids any negative impact on subsequent steps.

As described above, the substrate processing method according to the present embodiment allows the plasma post-processing using He gas or a mixed gas including He gas and Ar gas but not including hydrogen to be performed, obtaining a low-stress carbon film while maintaining favorable film quality. Thus, forming a carbon film with a thickness of 1 μm or more without film thickness dependence is possible.

Moreover, performing such post-processing enables the prevention of substrate warpage due to increased stress in the carbon film in the case of forming the carbon film and then annealing it at a temperature of approximately 400° C.

Further, since the formation of the carbon film and the subsequent plasma post-processing may be continuously performed in the same processing container of the same substrate processing apparatus by simply adjusting the gas and radio-frequency power settings, it is possible to form a low-stress carbon film without affecting productivity.

<Other Exemplary Substrate Processing Apparatus>

Figure 4:
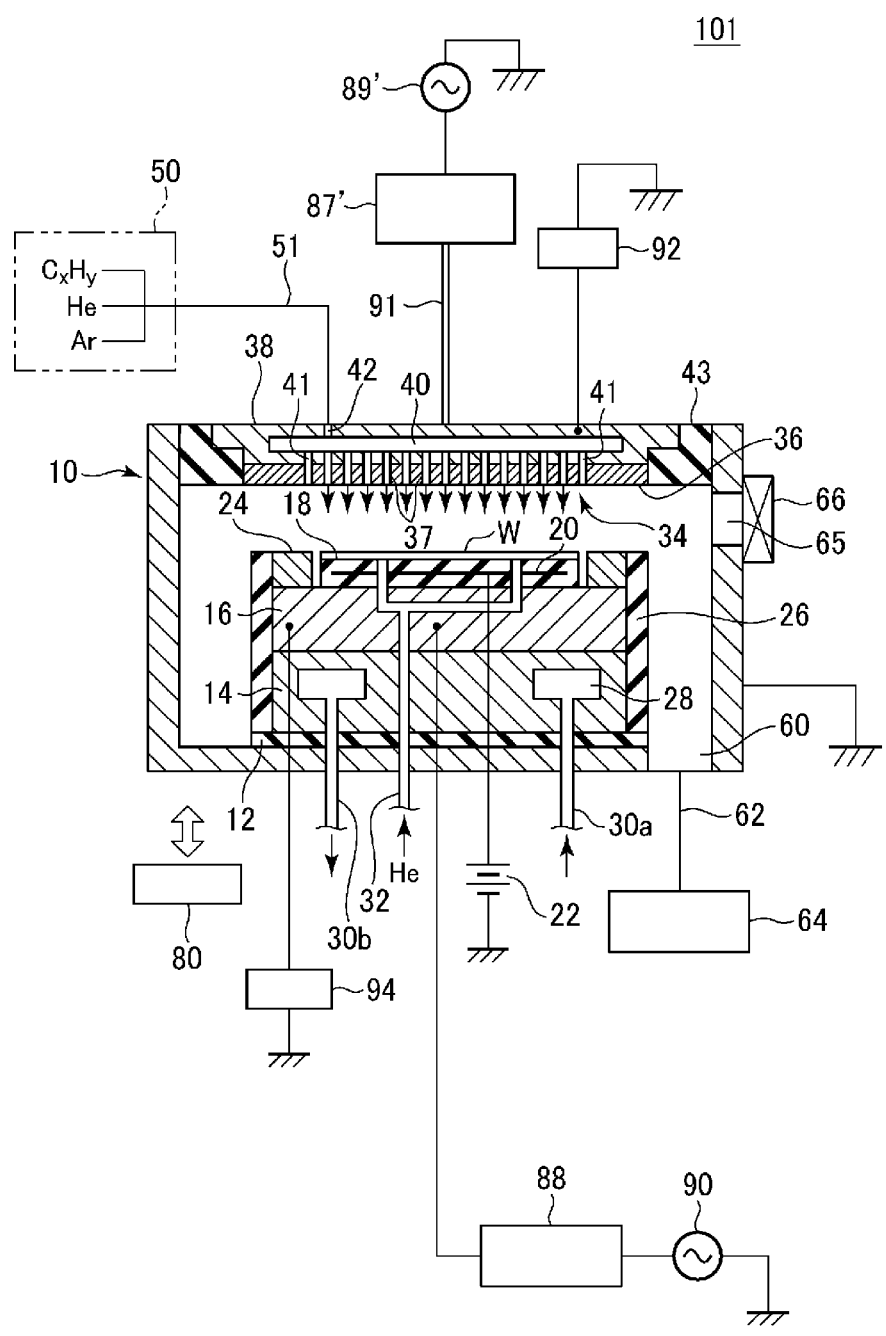
FIG. 4 is a cross-sectional view schematically illustrating another exemplary substrate processing apparatus that carries out the substrate processing method according to an embodiment.

FIG. 4 is a cross-sectional view schematically illustrating another exemplary substrate processing apparatus carrying out the substrate processing method according to an embodiment.

A substrate processing apparatus 101 according to the present embodiment is configured as a capacitively-coupled plasma processing apparatus similar to the substrate processing apparatus illustrated in FIG. 1. The substrate processing apparatus 101 has a first radio-frequency power supply 89' connected to the upper electrode 34 instead of the first radio-frequency power supply 89 with a higher frequency in FIG. 1. The first radio-frequency power supply 89' is connected to the upper electrode 34 via a matching unit 87' and a feed rod 91. The matching unit 87' is used to match the load (plasma) impedance with the impedance on the side of the first radio-frequency power supply 89'. The upper electrode 34 is electrically connected to a low-pass filter 92 that allows the radio frequency from the second radio-frequency power supply 90 to pass through to the ground while blocking the radio frequency from the first radio-frequency power supply 89'. Furthermore, the substrate stage 16, which is the lower electrode, is electrically connected to a high-pass filter 94 that allows the radio frequency from the first radio-frequency power source 89' to pass through to the ground.

In the substrate processing apparatus 101 illustrated in FIG. 4, other components are similar to those of the substrate processing apparatus 100 illustrated in FIG. 1. Thus, in FIG. 4, the same components as illustrated in FIG. 1 are denoted by the same reference numerals, and their descriptions are omitted.

In the substrate processing apparatus 101 illustrated in FIG. 4, radio-frequency power with a high frequency, preferably 100 MHz or higher, is supplied to the upper electrode 34 from the first radio-frequency power supply 89'. In addition, as in the substrate processing apparatus 100 illustrated in FIG. 1, radio-frequency power with a low frequency, preferably 13.56 MHz or lower, is supplied from the second radio-frequency power supply 90. The first radio-frequency power supply 89' and the second radio-frequency power supply 90 constitute a radio-frequency power supply unit.

In the substrate processing apparatus 101 illustrated in FIG. 4, upon forming the carbon film in step ST2, radio-frequency power for plasma generation is supplied to the upper electrode 34 from the first radio-frequency power source 89', and radio-frequency power for bias application is supplied to the substrate stage 16, which is the lower electrode, from the second radio-frequency power source 90. Step ST2 is performed under similar conditions to those described above, except that radio-frequency power for plasma generation is applied to the upper electrode 34.

Furthermore, in the plasma post-processing in step ST3, as in step ST2, two frequencies may be applied from the first radio-frequency power supply 89' and the second radio-frequency power supply 90. However, as in the substrate processing apparatus 100 illustrated in FIG. 1, one frequency may be applied and a frequency of 13.56 MHz or lower is preferable. In the substrate processing apparatus 101 illustrated in FIG. 4, as in the substrate processing apparatus illustrated in FIG. 1, radio-frequency power may be supplied to the substrate stage 16, which is the lower electrode, only from the second radio-frequency power supply 90 with a frequency of 13.56 MHz or lower. Other conditions are also carried out under conditions similar to those described above.

EXPERIMENTAL EXAMPLES

Experimental Examples are now described.

Experimental Example 1

In this example, the influence of the processing gas on the plasma post-processing after the formation of the carbon film was investigated.

Firstly, the substrate processing apparatus having the structure illustrated in FIG. 1 was used to form a carbon film under the following conditions.

10

Film Formation Conditions:
 Temperature: 60° C.
 Pressure: 20 mTorr
 Ar gas: 400 sccm
 $C_2H_2$ gas: 50 sccm
 First radio-frequency power supply (HF): 100 MHz, 2 kW
 Second radio-frequency power supply (LF): 13.56 MHz, 0.5 kW
 Time: 30 sec
 Subsequently, the plasma post-processing was performed using Ar gas, $H_2$ gas, $N_2$ gas, and He gas individually as the processing gas under the following conditions.
Plasma Post-Processing Conditions:
 Temperature: 60° C.
 Pressure: 20 mTorr
 Gas flow rate: 500 sccm
 First radio-frequency power supply (HF): 100 MHz, 1 kW
 Second radio-frequency power supply (LF): 13.56 MHz, 1 kW
 Time: 30 sec
 After performing the plasma post-processing using the above-mentioned processing gas, the thickness and stress of the carbon film were measured. The film thickness is expressed as a percentage (%), with the as-deposited thickness considered 100%. For comparison, even in the case of the absence of plasma post-processing (denoted as "Ref." in the figures), the thickness and stress of the carbon film were also measured. The obtained results are presented in FIG. 5.

Figure 5:
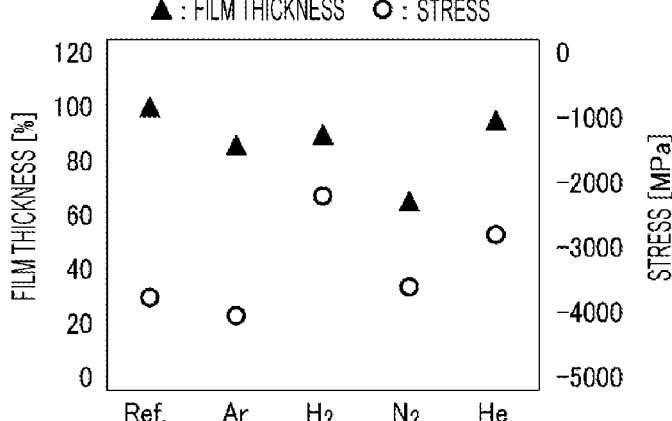
FIG. 5 is a diagram illustrating results obtained by measuring the film thickness and stress of a carbon film upon performing a plasma post-processing using Ar gas, $H_2$ gas, $N_2$ gas, and He gas as processing gases.

As illustrated in FIG. 5, no significant effect of reducing film stress was observed in the case of Ar gas. Furthermore, in the case of $N_2$ gas, the effect of reducing the film stress was small, and the reduction in the film thickness due to sputtering was considerable. Meanwhile, in the case of He gas and $H_2$ gas, the variation in film thickness after post-processing was minimal, and the effect of reducing the film stress was considerable.

Experimental Example 2

This experiment compared the plasma post-processing using He gas with that using $H_2$ gas.

Firstly, the substrate processing apparatus having the structure illustrated in FIG. 1 was used, and a carbon film was formed under the same conditions as in Experimental Example 1, except that the flow rate of the $C_2H_2$ gas was 180 sccm.

Figure 6:
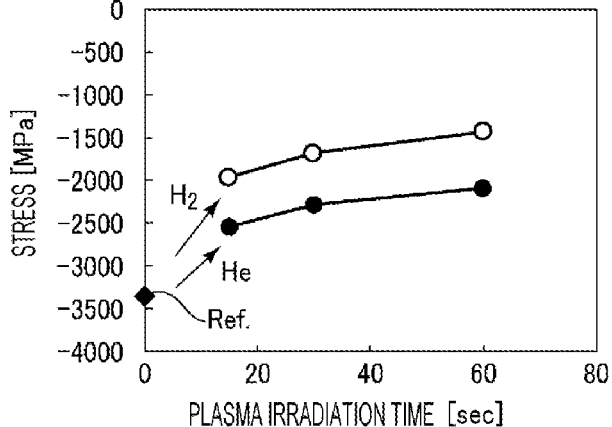
FIG. 6 is a diagram illustrating the relationship between processing time and film stress upon performing the plasma post-processing using He gas or $H_2$ gas.
Figure 7:
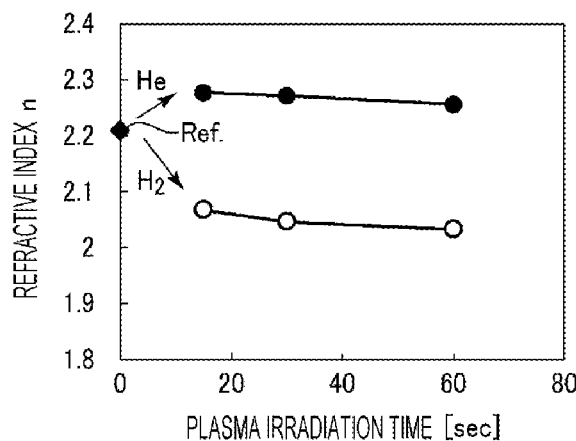
FIG. 7 is a diagram illustrating the relationship between processing time and refractive index, n, upon performing the plasma post-processing using He gas or $H_2$ gas.

Subsequently, the plasma post-processing was performed using He gas or $H_2$ gas, while varying the time, under the following common conditions.
Plasma Post-Processing Conditions:
 Temperature: 60° C.
 Pressure: 20 mTorr
 He or $H_2$ gas: 400 sccm
 Ar gas: 100 sccm
 HF (100 MHz): 0 W
 LF (13.56 MHz): 2 kW
 After performing the plasma post-processing under the conditions described above, the stress and refractive index, n, of the carbon film were measured. The refractive index n is an index that corresponds to the density of the carbon film, and there is a correspondence that the square of n is proportional to the density. FIG. 6 illustrates the relationship between processing time and film stress. FIG. 7 illustrates the relationship between processing time and refractive index n. Moreover, for comparison, FIGS. 6 and 7 also represent the results obtained from the case where the plasma post-processing was not performed (Ref.).

Figure 8:
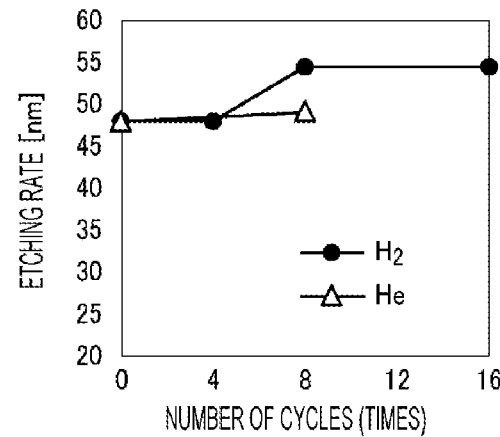
FIG. 8 is a diagram illustrating the relationship between the number of cycles and the dry etching rate (DER) upon performing the plasma post-processing cyclically using He gas or $H_2$ gas.

In addition, the carbon film, which was cyclically plasma-irradiated for every 30 seconds under the above-mentioned conditions using $H_2$ gas and He gas individually was subjected to dry etching. FIG. 8 is a diagram illustrating the relationship between the number of plasma irradiation cycles and the dry etching rate (DER).

As illustrated in FIG. 6, the stress decreased in both cases of using He gas and $H_2$ gas, and the stress reduction effect was greater with $H_2$ gas. However, as illustrated in FIG. 7, it was observed that the refractive index n did not decrease in the case of using the He gas, while the refractive index n decreased in the case of using the $H_2$ gas. In addition, as illustrated in FIG. 8, it was observed that the DER did not vary even after eight cycles in the case of using He gas, whereas the DER increased after eight cycles in the case of using $H_2$ gas.

As described above, although $H_2$ gas has a higher stress reduction effect, it lowers the film density and increases the DER, which leads to the deterioration of the carbon film quality. In contrast, He gas effectively reduces the stress without compromising the density of the carbon film or increasing the DER. Thus, it was found that He gas is suitable for use as the processing gas for plasma post-processing since there is no decrease in the film density or increase in the DER, unlike the case with $H_2$ gas.

Experimental Example 3

In Experimental Examples 1 and 2, it was determined that He gas is suitable for use as the processing gas for plasma post-processing. In this example, an experiment was conducted using He gas and Ar gas as the processing gas for plasma post-processing. Firstly, a carbon film was formed under the same conditions as in Experimental Example 2 using the substrate processing apparatus having the structure illustrated in FIG. 1.

Then, the plasma post-processing was performed using the changed flow rate ratio of He gas and Ar gas under the following conditions.
Plasma Post-Processing Conditions:
Temperature: 60° C.
Pressure: 20 mTorr
Gas flow rate: 500 sccm
HF (100 MHz): 0 W
LF (13.56 MHz): 2 kW
Time: 120 sec After performing the plasma post-processing as described above, the relationship between the flow rate ratio of He gas to the total of He gas and Ar gas, He gas flow rate/(He gas flow rate+Ar gas flow rate)×100%, (hereinafter referred to as "He/(He+Ar) ratio") and the quantity of variation in the stress of the carbon film was determined. Additionally, the relationship between the He/(He+Ar) ratio and the quantity of variation in the thickness of the carbon film was determined. The obtained results are presented in FIGS. 9 and 10.

Figure 9:
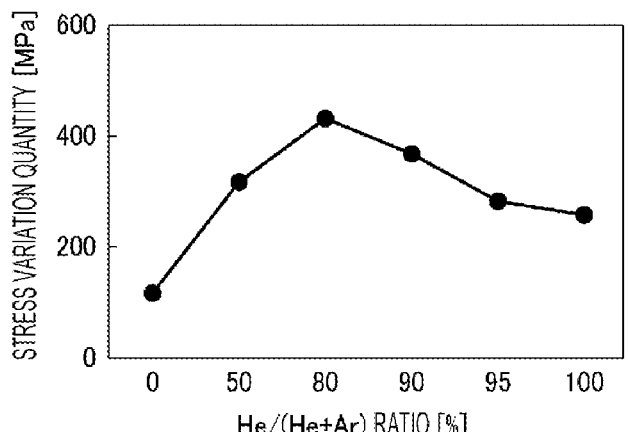
FIG. 9 is a diagram illustrating the relationship between a He/(He+Ar) ratio and a quantity of variation in the stress of a carbon film during the plasma post-processing.
Figure 10:
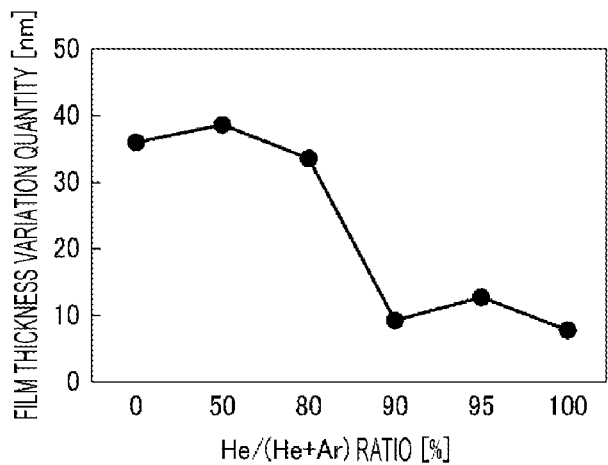
FIG. 10 is a diagram illustrating the relationship between the He/(He+Ar) ratio and a quantity of variation in the film thickness of a carbon film during the plasma post-processing.

The plasma post-processing is more desirable as the quantity of variation in stress (stress improvement effect) is larger and the quantity of variation in film thickness is smaller. As seen in FIG. 9, the quantity of variation in stress is the highest at the He/(He+Ar) ratio of 80%, and the high quantity of variation in stress is maintained even with a He gas ratio of 100%. Furthermore, as seen in FIG. 10, the quantity of variation in film thickness significantly decreases when the He/(He+Ar) ratio exceeds 80%. Based on these findings, the preferred He/(He+Ar) ratio was determined to be 80% or higher, more preferably 90% or higher.

Experimental Example 4

In this example, an experiment was conducted to investigate the influence of pressure on the plasma post-processing. Firstly, a carbon film was formed under the same conditions as in Experimental Example 2 using the substrate processing apparatus having the structure illustrated in FIG. 1.

Subsequently, the plasma post-processing was performed while changing the pressure under the following conditions.
Plasma Post-Processing Conditions:
Temperature: 60° C.
He gas: 400 sccm
Ar gas: 100 sccm
HF (100 MHz): 0 W
LF (13.56 MHz): 2 kW
Time: 120 sec After the plasma post-processing was performed as described above, the relationship between the pressure and the quantity of variation in the stress of the carbon film and the relationship between the pressure and the quantity of variation in thickness of the carbon film were determined. The obtained results are presented in FIGS. 11 and 12.

Figure 11:
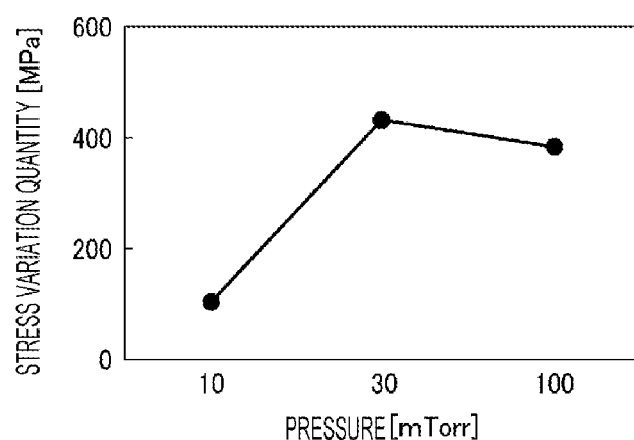
FIG. 11 is a diagram illustrating the relationship between the pressure and the quantity of variation in the stress of a carbon film during the plasma post-processing.
Figure 12:
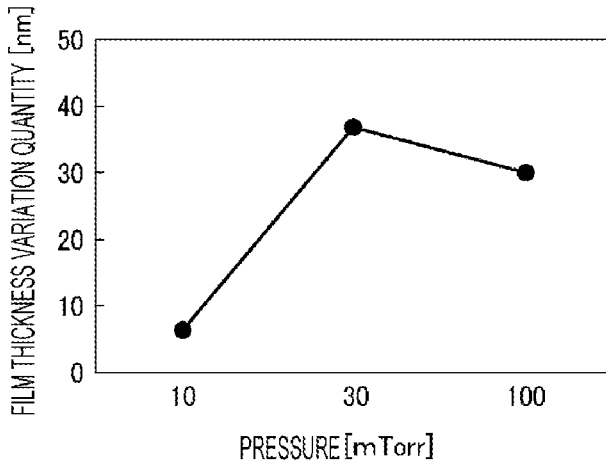
FIG. 12 is a diagram illustrating the relationship between the pressure and the quantity of variation in the film thickness of a carbon film during the plasma post-processing.

As described above, the plasma post-processing is more desirable as the quantity of variation in the stress (stress improvement effect) is larger and the quantity of variation in film thickness is smaller. As seen in FIG. 11, the highest variation in stress occurs at a pressure of 30 mTorr. Furthermore, as seen in FIG. 12, the quantity of variation in film thickness increases at a pressure of 30 mTorr. Although the quantity of variation in film thickness is small at a pressure of 10 mTorr, the quantity of variation in the stress is also low, leading to a lower stress improvement effect. Meanwhile, the quantity of variation in the stress is lower at a pressure of 100 mTorr than at 30 mTorr, but it still remains relatively high, and the quantity of variation in film thickness is also reduced. Based on these findings, it was determined that the quantity of variation in film thickness was slightly increased at 30 mTorr, but the quantity of variation in the stress was large. Thus, it was concluded that 30 mTorr around was preferred.

Experimental Example 5

In this example, an experiment was conducted to investigate the influence of radio-frequency power in the plasma post-processing. Firstly, a carbon film was formed using the substrate processing apparatus having the structure illustrated in FIG. 1, under the same conditions as in Experimental Example 1.

Subsequently, the plasma post-processing was performed under the following common conditions while changing the radio-frequency power application conditions.
Plasma Post-Processing Conditions
Temperature: 60° C.
Pressure: 20 mTorr
He gas: 400 sccm
Ar gas: 100 sccm
Time: 120 sec The radio-frequency power application conditions were set to the following conditions: Condition A, where both HF (100 MHz) and LF (13.56 MHz) were set to 1,000 W, Condition B, where only HF (100 MHz) was set to 2,000 W, and Condition C, where only LH (13.56 MHz) was set to 2,000 W.

After the plasma post-processing was performed by changing the radio-frequency power application conditions as described above, the film thickness and stress of the carbon film were measured. The film thickness is expressed in percentage (%), with the as-deposited thickness considered 100%. For comparison, even in the case of the absence of plasma post-processing (Ref.), the thickness and stress of the carbon film were also measured. The obtained results are presented in FIG. 13.

Figure 13:
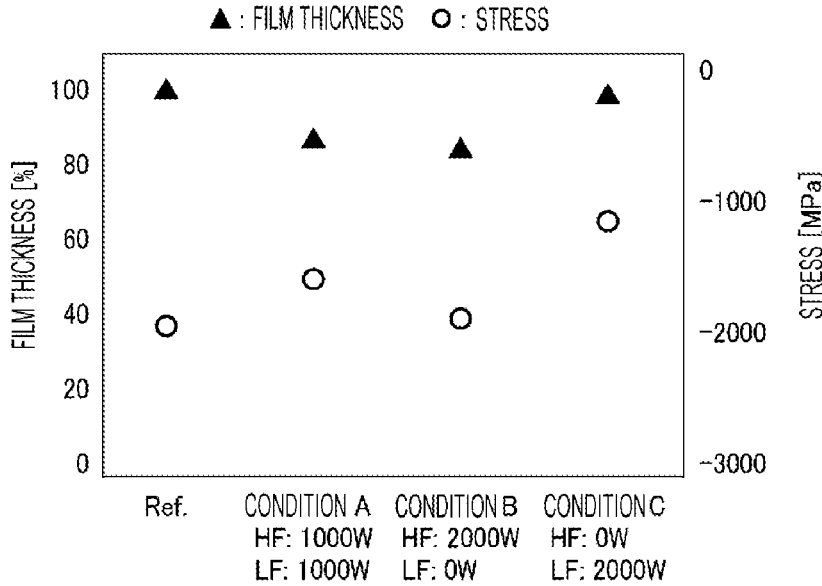
FIG. 13 is a diagram illustrating results obtained by measuring the thickness and stress of the carbon film when performing the plasma post-processing while varying the application conditions of radio-frequency power.

As seen in FIG. 13, in the case where only 100 MHz was applied under Condition B, the stress did not decrease, and there was a significant variation in film thickness. Moreover, in the case where both 100 MHz and 13.56 MHz were applied under Condition A, the stress reduction was insignificant, and there was a considerable variation in film thickness. In contrast, in the case where only 13.56 MHz was applied under Condition C, it was determined that the stress reduction was significant while keeping the variation in film thickness small.

Experimental Example 6

In this example, an experiment was conducted to investigate the influence of film thickness in the plasma post-processing. Firstly, carbon films with film thicknesses of 320 nm, 560 nm, and 1,100 nm were formed by changing the processing time using the substrate processing apparatus having the structure illustrated in FIG. 1 under the following conditions.

Figure 14:
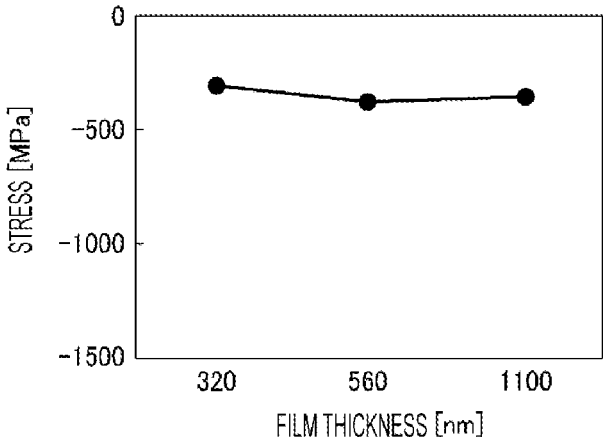
FIG. 14 is a diagram illustrating the relationship between the thickness and the stress of the carbon film during the plasma post-processing.

Film Formation Conditions:
 Temperature: 60° C.
 Pressure: 20 mTorr
 Ar gas: 45 sccm
 $C_2H_2$ gas: 180 sccm
 HF (100 MHz): 2 kW
 LF (13.56 MHz): 0.5 kW Subsequently, the plasma post-processing was performed under the following conditions.
Plasma Post-Processing Conditions:
 Temperature: 60° C.
 Pressure: 20 mTorr
 He gas: 400 sccm
 Ar gas: 100 sccm
 HF (100 MHz): 0 W
 LF (13.56 MHz): 2 kW
 Time: 120 sec After performing the plasma post-processing as described above, the relationship between the film thickness and the stress was determined. The obtained results are presented in FIG. 14. As seen in this figure, the stress reduction effect was achieved independently of the film thickness. Thus, it was concluded that the dependence of the stress reduction effect on the film thickness was minimal.

Figure 15:
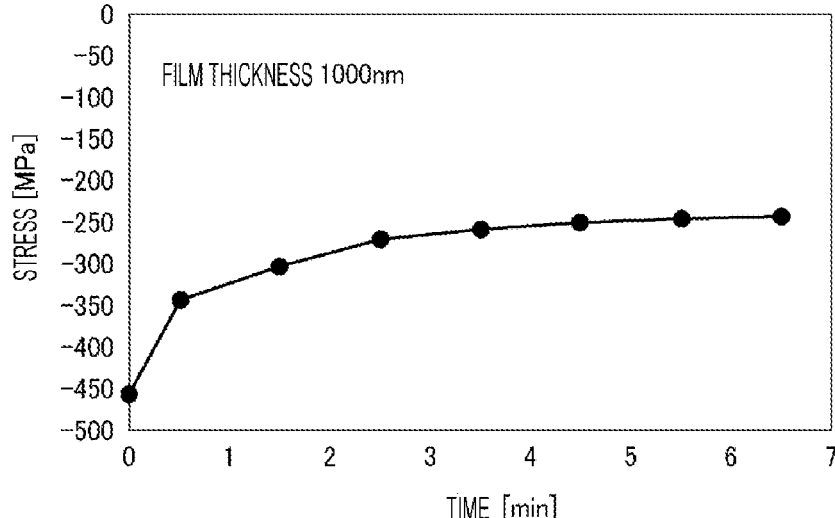
FIG. 15 is a diagram illustrating the relationship between the post-processing time and stress when subjecting a carbon film with a thickness of 1000 nm to the plasma post-processing.

Further, after forming the carbon film with the film thickness of 1,000 nm (1 μm) under the conditions mentioned above, the plasma post-processing was performed by varying the time. FIG. 15 illustrates the relationship between the post-processing time and the stress in such a situation. As seen in this figure, it was determined that the stress reduction effect may be achieved even when the film thickness of the carbon film is as thick as 1 μm by processing it for approximately 2 minutes.

Experimental Example 7

Figure 16:
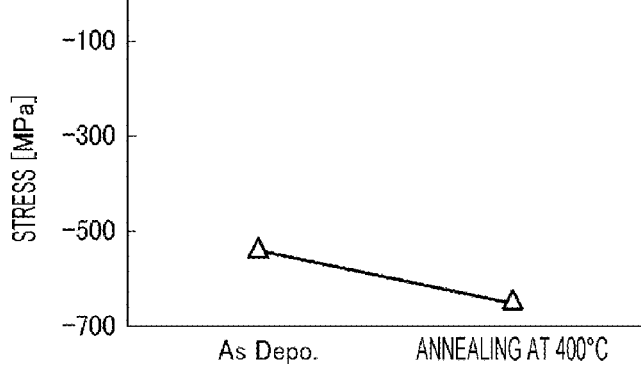
FIG. 16 is a diagram illustrating the stress values of a carbon film in an as-deposited state (As Depo.) and after annealing, when the carbon film is formed and then annealed at a temperature of 400° C.

In this example, an experiment was conducted to investigate the influence of annealing on a carbon film. Firstly, a carbon film with a film thickness of 1,000 nm (1 μm) was formed on the substrate using the substrate processing apparatus having the structure illustrated in FIG. 1 under conditions similar to those of Experimental Example 6. Subsequently, annealing was performed at a temperature of 400° C. to simulate the formation of a SiON film. The stress of the as-deposited carbon film (denoted as "As Depo." in the figures) and the stress of the carbon film after annealing were measured. The obtained results are presented in FIG. 16. As can be seen from this figure, the stress of the as-deposited carbon film was high, measuring at −500 Pa or more, and the stress was further increased after annealing at a temperature of 400° C.

Figure 17:
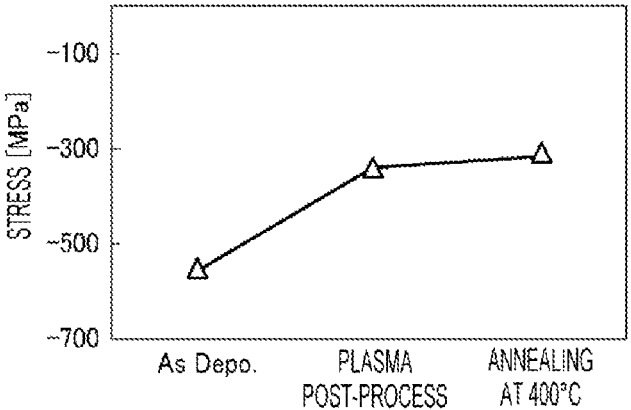
FIG. 17 is a diagram illustrating the stress values of a carbon film in an as-deposited state (As Depo.), after plasma post-processing, and after annealing, when the carbon film is formed, subjected to the plasma post-processing, and then annealed at a temperature of 400° C.

Subsequently, after forming the carbon film on the substrate under similar conditions, the plasma post-processing was performed under conditions similar to those of Experimental Example 6. Then, annealing was performed at a temperature of 400° C. to simulate the formation of a SiON film. The stress of the carbon film was measured in three stages: as deposited (As Depo.), after post-processing, and after annealing. The obtained results are presented in FIG. 17. As seen in this figure, it was determined that the stress of the carbon film was reduced by approximately 200 MPa through the plasma post-processing and further reduced by annealing at a temperature of 400° C.

OTHER APPLICATIONS

The embodiments have been described above, the embodiments described herein should be understood to be illustrative and not restrictive in all respects. The above-described embodiments may be omitted, substituted, or modified in various ways without departing from the scope and spirit of the appended claims.

In one example, in the embodiments described above, the capacitively-coupled plasma processing apparatus has been used as an example of the substrate processing apparatus. However, the present embodiments should be understood to be not limited to this, and other plasma sources such as inductively coupled plasma or microwave plasma may be used.

Further, in the embodiments described above, the carbon film formation and the plasma post-processing are continuously performed in the same processing chamber, but may be performed in separate processing chambers. In that case, the plasma used in the carbon film formation and the plasma post-processing may be generated through the same generation technique or by different generation techniques.

LIST OF REFERENCE NUMERALS

10: processing container
 16: substrate stage (lower electrode)
 34: upper electrode
 50: gas supply unit
 64: exhaust device
 80: control unit
 89: first radio-frequency power supply
 90: second radio-frequency power supply
 100, 101: substrate processing apparatus
 W: substrate

What is claimed is:
1. A substrate processing method comprising:
 forming a carbon film on a substrate by plasma CVD using a first processing gas including a carbon-containing gas; and performing a plasma post-processing on the carbon film formed at the forming, thereby reducing film stress of the carbon film by plasma generated from a second processing gas including helium gas or a mixture of helium gas and argon gas but not including hydrogen, wherein the forming of the carbon film and the performing of the plasma post-processing are carried out using capacitively-coupled plasma generated by forming a radio-frequency electric field between a lower electrode serving as a stage on which the substrate is mounted, and an upper electrode facing the lower electrode, and the performing of the plasma post-processing is carried out by applying a radio-frequency power with a frequency of 13.56 MHz or less only to the lower electrode.

2. The substrate processing method according to claim 1, wherein when a flow rate ratio of helium gas to a total of helium gas and argon gas is represented as helium gas flow rate/(helium gas flow rate+argon gas flow rate)×100%, the performing of the plasma post-processing is carried out at the flow rate ratio of 80% or higher.

3. The substrate processing method according to claim 1, wherein the forming of the carbon film is carried out using, as the first processing gas, a gas including the carbon-containing gas and a diluent gas that includes a noble gas.

4. The substrate processing method according to claim 1, wherein the forming of the carbon film and the performing of the plasma post-processing are continuously carried out in an identical processing container.

5. The substrate processing method according to claim 1, wherein the forming of the carbon film is carried out by applying a first radio-frequency power with a frequency of 100 MHz or higher to the lower electrode or the upper electrode and applying a second radio-frequency power with a frequency of 13.56 MHz to the lower electrode.

6. The substrate processing method according to claim 1, wherein the performing of the plasma post-processing is carried out at a pressure of 1.33 to 13.3 Pa.

7. The substrate processing method according to claim 1, wherein the carbon film is used as a hard mask.

8. The substrate processing method according to claim 1, wherein after the performing of the plasma post-processing, the film stress of the carbon film is not increased when the carbon film is subjected to annealing in a range of 200° C. and 450° C.

9. The substrate processing method according to claim 1, further comprising:

after the performing of the plasma post-processing, annealing the carbon film at a temperature in a range of 200° C. and 450° C.

10. The substrate processing method according to claim 1, wherein the performing of the plasma post-processing is carried out at a temperature of 200° C. or less.

11. The substrate processing method according to claim 1, wherein a flow rate of the second processing gas during the plasma post-processing is set to be between 10 and 500 sccm.

* * * * *